United States Patent
Azadet et al.

(10) Patent No.: US 7,834,788 B2
(45) Date of Patent: Nov. 16, 2010

(54) METHODS AND APPARATUS FOR DECORRELATING QUANTIZATION NOISE IN A DELTA-SIGMA MODULATOR

(75) Inventors: Kameran Azadet, Morganville, NJ (US); Samer Hijazi, Bethlehem, PA (US); Joseph H. Othmer, Ocean, NJ (US)

(73) Assignee: LSI Corporation, Milpitas, CA (US)

( * ) Notice: Subject to any disclaimer, the term of this patent is extended or adjusted under 35 U.S.C. 154(b) by 33 days.

(21) Appl. No.: 12/415,012

(22) Filed: Mar. 31, 2009

(65) Prior Publication Data

US 2010/0245138 A1    Sep. 30, 2010

(51) Int. Cl.
*H03M 3/00* (2006.01)
(52) U.S. Cl. .................. 341/143; 341/155
(58) Field of Classification Search .......... 341/143, 341/155
See application file for complete search history.

(56) References Cited

U.S. PATENT DOCUMENTS 5,959,562 A * 9/1999 Wiesbauer ........... 341/143
2009/0041367 A1 * 2/2009 Mansour ............. 382/252

* cited by examiner

*Primary Examiner*—Jean B Jeanglaude
(74) *Attorney, Agent, or Firm*—Ryan, Mason & Lewis, LLP

(57) ABSTRACT

Methods and apparatus are provided for decorrelating quantization noise in a delta-sigma modulator. An input signal is quantized using a predictive delta-sigma modulator, by quantizing the input signal using a quantizer; determining a quantization error associated with the quantizer by subtracting an input to the quantizer from an output of the quantizer; measuring a correlation coefficient between the quantization error and an input to the quantizer; reducing the measured correlation by subtracting a multiple of the input to the quantizer from the quantization error, wherein the multiple is based on the correlation coefficient; generating an error prediction value using an error predictive filter; and subtracting the error prediction value from the input signal.

12 Claims, 1 Drawing Sheet

METHODS AND APPARATUS FOR DECORRELATING QUANTIZATION NOISE IN A DELTA-SIGMA MODULATOR

FIELD OF THE INVENTION

The present invention is related to delta-sigma modulators and, more particularly, to techniques to reduce the correlation between the quantization noise and the input signal in such delta-sigma modulators.

BACKGROUND OF THE INVENTION

Delta-sigma ($\Delta$-$\Sigma$) modulators, sometimes referred to as sigma-delta ($\Sigma$-$\Delta$) modulators, encode higher resolution signals into lower resolution signals. Delta-sigma modulators have found increasing use in a range of modern electronic components, such as digital-to-analog converters (DACs), analog-to-digital converters (ADCs) and frequency synthesizers. For example, delta-sigma modulators have been proposed or suggested for directly synthesizing RF signals from information carrying digital base band signals.

Delta-sigma modulators typically quantize an input signal and determine a quantization error by comparing the input signal to the quantized output value. The quantization error is often assumed to be uncorrelated to the input signal. More typically, however, the error signal is correlated to the input. Thus, the delta-sigma modulator may suffer from noise coloration due to the correlation of the quantization noise with the input signal, particularly for low resolution quantizers.

A need therefore exists for techniques to reduce the correlation between the quantization noise and the input signal, without significantly degrading the signal to noise ratio.

SUMMARY OF THE INVENTION

Generally, methods and apparatus are provided for decorrelating quantization noise in a delta-sigma modulator. According to one aspect of the invention, an input signal is quantized using a predictive delta-sigma modulator, by quantizing the input signal using a quantizer; determining a quantization error associated with the quantizer by subtracting an input to the quantizer from an output of the quantizer; measuring a correlation coefficient between the quantization error and an input to the quantizer; reducing the measured correlation by subtracting a multiple of the input to the quantizer from the quantization error, wherein the multiple is based on the correlation coefficient; generating an error prediction value using an error predictive filter; and subtracting the error prediction value from the input signal.

The correlation coefficient, $\beta$, can be obtained, for example, using an LMS algorithm. In a further variation, a tap adaptation of the correlation coefficient, $\beta$, employs tap leakage. In yet another variation, a tap adaptation of the correlation coefficient, $\beta$, employs a variable step size.

A more complete understanding of the present invention, as well as further features and advantages of the present invention, will be obtained by reference to the following detailed description and drawings.

DETAILED DESCRIPTION

The present invention provides improved techniques for reducing the correlation between the quantization noise and the input signal in a delta-sigma modulator.

Figure 1:
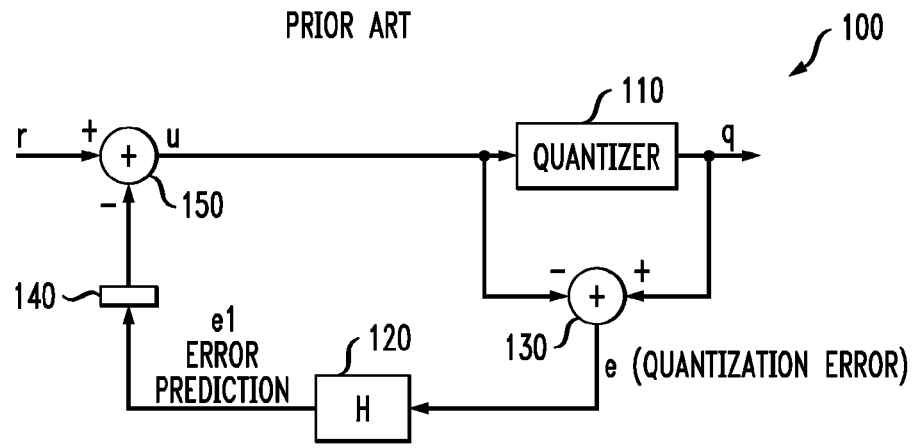
FIG. 1 illustrates an exemplary conventional delta-sigma modulator.

FIG. 1 illustrates an exemplary conventional delta-sigma modulator 100. As shown in FIG. 1, the exemplary delta-sigma modulator 100 employs a quantizer 110, such as a one bit quantizer, and an error predictive filter 120. The input value, u, to the quantizer 110 is compared to the quantized output value, q, by an adder 130 that generates a quantization error, e. The quantization error, e, is processed by the error predictive filter 120 to generate an error prediction value, e1, that is stored in a register 140 for one clock cycle and then subtracted from the input signal, r, by an adder 150 that generates the error-compensated input value, u. Generally, error predictive filters 120 employ some knowledge of the input signal to filter the signal, in a known manner. For example, if the error is known to be slowly varying, the error predictive filter 120 can use the same value for subsequent samples. The input signal, r, may be, for example, a 16 bit digital value, and the one bit quantization performed by the quantizer 110 (e.g., the quantization can be based on the polarity of the input signal) provides a coarse analog conversion. The quantization error, e, associated with the one bit quantizer 110 is primarily out-of-band. As previously indicated, the one bit quantization performed by the exemplary quantizer 110 is inherently linear.

The quantization error, e(n), at a time n, is often assumed to be uncorrelated to the input r(n). See, e.g., PCT Patent Application Serial No. PCT/US09/38929, entitled "Methods and Apparatus for Direct Synthesis of RF Signals Using Delta-Sigma Modulator," filed contemporaneously herewith and incorporated by reference herein. More typically, however, the error signal may be correlated to the input. Thus, the delta-sigma modulator 100 may suffer from noise coloration due to the correlation of the quantization noise with the input of the quantizer 110, particularly for low resolution quantizers, such as the one bit quantizers described herein. In order to reduce the effects of the correlation between the quantization noise and the input, a dithering configuration or a decorrelating configuration (or both) can be employed to reduce the noise correlation without significantly degrading the signal to noise ratio. For a more detailed discussion of a dithering configuration, see U.S. patent application Ser. No. 12/414,999, entitled "Methods and Apparatus for Whitening Quantization Noise in a Delta-Sigma Modulator Using Dither Signal," filed contemporaneously herewith and incorporated by reference herein.

Typically, the one bit quantization performed by the quantizer 110 would require a high oversampling ratio. For example, audio encoding techniques that employ one bit quantization of audio signals that are on the order of 100 KHz typically oversample the audio signal at a rate of 20 MHz. Such oversampling is not practical in the wireless communication context of the present invention, where the signals are typically on the order of multiple GHz. The desired low oversampling rates of the present invention, however, would typically lead to an unstable encoder. As discussed hereinafter, aspects of the present invention provide techniques for providing a stable encoder based on one bit quantization.

According to one aspect of the invention, well-known decorrelating techniques are employed to reduce noise correlation to the quantizer 110 of the exemplary delta-sigma modulator 100 by reducing the correlation between the quantization error, e, and the input, r. As discussed hereinafter, a leakage path 210 is added to the conventional delta-sigma modulator 100 of FIG. 1. Generally, the disclosed decorrelating stability techniques measure the correlation between the quantization error, e, and the input, r, and cancel the correlation. In this manner, the disclosed decorrelating stability techniques substantially whiten the quantization noise and thereby help to stabilize the modulator 100 and remove spurs.

Figure 2:
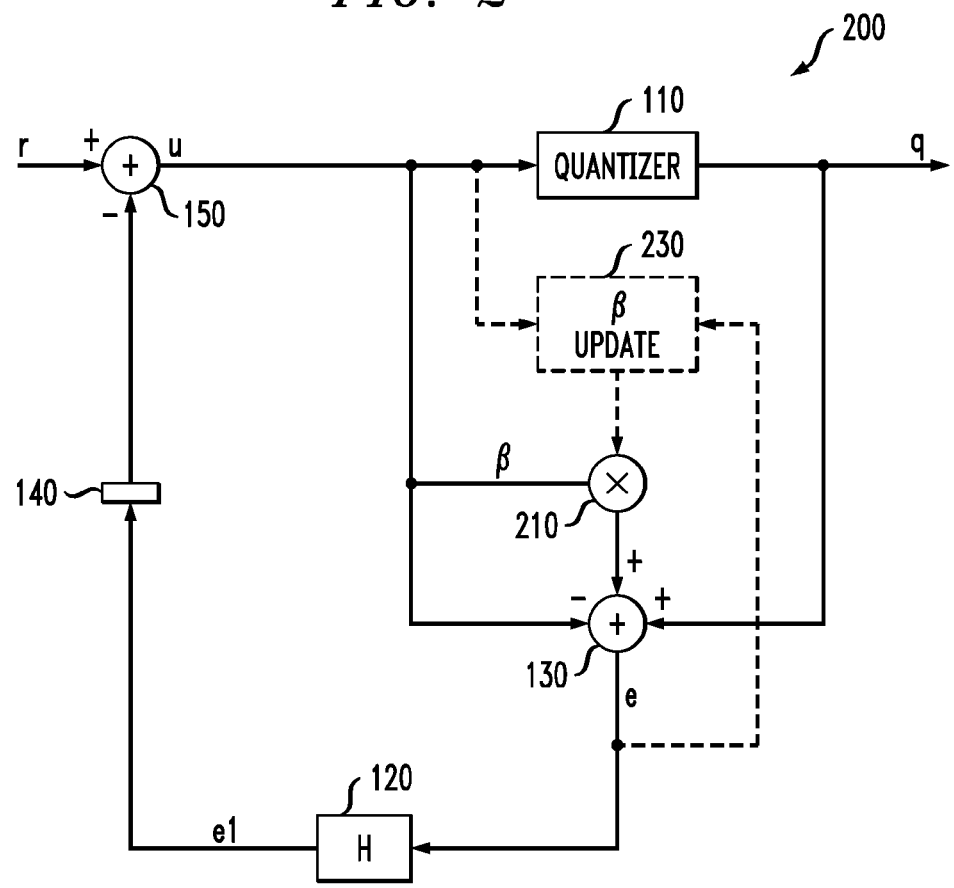
FIG. 2 illustrates an exemplary delta-sigma modulator in accordance with the decorrelating techniques of the present invention.

FIG. 2 illustrates an exemplary delta-sigma modulator 200 in accordance with the decorrelating techniques of the present invention. As shown in FIG. 2, the exemplary delta-sigma modulator 200 employs a quantizer 110 and an error predictive filter 120, in a similar manner to the conventional delta-sigma modulator 100 of FIG. 1. The input value to the quantizer 110 is compared to the output value, q, by an adder 130 that generates a quantization error, e. The quantization error, e, is processed by the error predictive filter 120 to generate an error prediction value, e1, that is stored in a register 140 for one clock cycle and then subtracted from the input signal, r, by an adder 150 that generates an error-compensated input value, u.

As shown in FIG. 2, the exemplary delta-sigma modulator 200 employs well-known decorrelating techniques using a leakage path 210. The leakage coefficient, β, of the leakage path 210 is selected to reduce the correlation between the quantization error, e, and the input, u, to the quantizer 110. The leakage coefficient, β, is computed by a β update block 230. Generally, the correlation between the quantization error, e, and the input, r, is obtained by integrating quantization error, e, and the quantizer input, u. In this manner, the correlation between the quantization error, e, and the quantizer input, u, is reduced. In one embodiment, the leakage coefficient, β, can be obtained using a least mean square (LMS) algorithm as follows:

$$\beta_k = \beta_{k-1} - \mu \cdot e_k \cdot u_k \quad (1)$$

where is μ is the LMS step size.

In a further variation, a more stable implementation of tap adaptation can employ tap leakage:

$$\beta_k = (1-\eta) \cdot \beta_{k-1} - \mu \cdot e_k \cdot u_k \quad (2)$$

where η is a leakage coefficient and μ is the step size.

In yet another variation, generally for faster convergence, a variable step size, μ can be employed:

$$\beta_k = (1-\eta) \cdot \beta_{k-1} - (\mu \cdot e_k^4) \cdot e_k \cdot u_k \quad (3)$$

Generally, equation (3) links the step size with the quantization error, e, whereby the step size is reduced as the error decreases. It is noted that the step size, μ, in equation (2) is replaced by $\mu \cdot e_k^4$ in equation (3). Thus, if the loop becomes unstable, e increases rapidly (clipped quantizer state) and μ increases quadratically with e, accelerating convergence speed of β.

CONCLUSION

While exemplary embodiments of the present invention have been described with respect to digital logic blocks, as would be apparent to one skilled in the art, various functions may be implemented in the digital domain as processing steps in a software program, in hardware by circuit elements or state machines, or in combination of both software and hardware. Such software may be employed in, for example, a digital signal processor, application specific integrated circuit or micro-controller. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, wherein, when the program code is loaded into and executed by a machine, such as a processor, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital signal processor, a microprocessor, and a micro-controller.

It is to be understood that the embodiments and variations shown and described herein are merely illustrative of the principles of this invention and that various modifications may be implemented by those skilled in the art without departing from the scope and spirit of the invention.

We claim:

1. A method for quantizing an input si al using a predictive delta-sigma modulator, comprising:
   quantizing said input signal using a quantizer;
   determining a quantization error associated with said quantizer by subtracting an input to said quantizer from an output of said quantizer;
   measuring a correlation coefficient between said quantization error and an input to said quantizer;
   reducing said measured correlation by subtracting a multiple of said input to said quantizer from said quantization error, wherein said multiple is based on said correlation coefficient;
   generating an error prediction value using an error predictive filter; and
   subtracting said error prediction value from said input signal.

2. The method of claim 1, wherein said correlation coefficient, β, is obtained using an LMS algorithm.

3. The method of claim 1, wherein a tap adaptation of said correlation coefficient, β, employs tap leakage.

4. The method of claim 1, wherein a tap adaptation of said correlation coefficient, β, employs a variable step size.

5. A predictive delta-sigma modulator for quantizing an input signal, comprising:
   a quantizer for quantizing said input signal;
   an adder for determining a quantization error associated with said quantizer by subtracting an input to said quantizer from an output of said quantizer;
   an update block for measuring a correlation coefficient between said quantization error and an input to said quantizer;
   an adder for reducing said measured correlation by subtracting a multiple of said input to said quantizer from said quantization error, wherein said multiple is based on said correlation coefficient;
   an error predictive filter for generating an error prediction value; and
   an adder for subtracting said error prediction value from said input signal.

6. The predictive delta-sigma modulator of claim 5, wherein said correlation coefficient, β, is obtained using an LMS algorithm.

7. The predictive delta-sigma modulator of claim 5, wherein a tap adaptation of said correlation coefficient, β, employs tap leakage.

8. The predictive delta-sigma modulator of claim 5, wherein a tap adaptation of said correlation coefficient, $\beta$, employs a variable step size.

9. An integrated circuit, comprising:
a predictive delta-sigma modulator for quantizing an input signal, comprising:
a quantizer for quantizing said input signal;
an adder for determining a quantization error associated with said quantizer by subtracting an input to said quantizer from an output of said quantizer;
an update block for measuring a correlation coefficient between said quantization error and an input to said quantizer;
an adder for reducing said measured correlation by subtracting a multiple of said input to said quantizer from said quantization error, wherein said multiple is based on said correlation coefficient;
an error predictive filter for generating an error prediction value; and
an adder for subtracting said error prediction value from said input signal.

10. The integrated circuit of claim 9, wherein said correlation coefficient, $\beta$, is obtained using an LMS algorithm.

11. The integrated circuit of claim 9, wherein a tap adaptation of said correlation coefficient, $\beta$, employs tap leakage.

12. The integrated circuit of claim 9, wherein a tap adaptation of said correlation coefficient, $\beta$, employs a variable step size.

* * * * *

UNITED STATES PATENT AND TRADEMARK OFFICE
CERTIFICATE OF CORRECTION

| | | |
|---|---|---|
| PATENT NO. | : 7,834,788 B2 | Page 1 of 1 |
| APPLICATION NO. | : 12/415012 | |
| DATED | : November 16, 2010 | |
| INVENTOR(S) | : Kameran Azadet | |

It is certified that error appears in the above-identified patent and that said Letters Patent is hereby corrected as shown below:

In claim 1, column 4, line 22, "si nal" should be replaced by -- signal --.

Signed and Sealed this
Twenty-fifth Day of December, 2012

David J. Kappos
*Director of the United States Patent and Trademark Office*